United States Patent
Scherer et al.

(10) Patent No.: US 7,221,284 B2
(45) Date of Patent: May 22, 2007

(54) NETWORKING CABLE TRACER SYSTEM

(75) Inventors: Christopher Briand Scherer, Austin, TX (US); Jonathan Keith Sholtis, Buda, TX (US)

(73) Assignee: Mertek Industries, LLC, Austin, TX (US)

( * ) Notice: Subject to any disclaimer, the term of this patent is extended or adjusted under 35 U.S.C. 154(b) by 170 days.

(21) Appl. No.: 11/105,487

(22) Filed: Apr. 13, 2005

(65) Prior Publication Data

US 2006/0232385 A1    Oct. 19, 2006

(51) Int. Cl.
G08B 5/22 (2006.01)
(52) U.S. Cl. .................. 340/815.45; 340/815.47; 340/286.02
(58) Field of Classification Search ............ 340/815.4, 340/815.45, 815.47, 815.48, 286.01, 286.02, 340/286.04, 310.01, 310.11; 324/66, 67, 324/539
See application file for complete search history.

(56) References Cited

U.S. PATENT DOCUMENTS

| 3,960,428 | A |   | 6/1976  | Naus et al. |
|---|---|---|---|---|
| 4,761,720 | A |   | 8/1988  | Solow |
| 4,837,488 | A | * | 6/1989  | Donahue ................. 324/66 |
| 5,159,316 | A | * | 10/1992 | Lazzara ................. 340/568.2 |
| 5,741,152 | A |   | 4/1998  | Boutros |
| 5,764,043 | A |   | 6/1998  | Czosnowski et al. |
| 6,532,328 | B1 | * | 3/2003  | Kline ................. 385/101 |
| 6,577,243 | B1 |   | 6/2003  | Dannenmann et al. |
| 6,790,096 | B2 |   | 9/2004  | Lin |
| 6,798,183 | B2 | * | 9/2004  | Bohley et al. ................. 324/66 |
| 6,975,242 | B2 | * | 12/2005 | Dannenmann et al. . 340/815.45 |
| 7,049,937 | B1 | * | 5/2006  | Zweig et al. .......... 340/310.11 |
| 2002/0031955 | A1 |   | 3/2002  | Schmidt et al. |
| 2003/0222786 | A1 |   | 12/2003 | Dannenmann et al. |
| 2004/0160774 | A1 |   | 8/2004  | Lionetti et al. |

* cited by examiner

*Primary Examiner*—Van T. Trieu
(74) *Attorney, Agent, or Firm*—Michael Ervin; M.A. Ervin & Associates

(57) ABSTRACT

A method and apparatus for providing a tracer function for networked cable systems used in information technology. A self contained and self powered indicator circuit is described that enables tracing the location of both ends of a networked cable without the use of external test equipment.

16 Claims, 5 Drawing Sheets

NETWORKING CABLE TRACER SYSTEM

FIELD OF THE INVENTION

This invention relates to a method and apparatus for readily tracing remote connective portions of networking cables that are widely used in the information technology sector.

BACKGROUND OF THE INVENTION

The purpose of any networking cable is to carry data from one electronic device to another. Electronic devices include but are not limited to terminals, personal computers, printers, workstations, hubs, switches, storage devices, tape drives, routers, telephone switches, and servers. Networking cables, frequently referred to, as "jumper cables", "patch cables", or simply "cables", typically are multiple pair copper wires packaged in an outer flexible sheath. Networking cables are designed to interconnect an electronic device with another electronic device. Such networking cables often are used in systems where there are many networking cables connected to frames, panels, or electronic devices, each of which may have many connecting cables and which may be located closely adjacent other similar frames, panels, or electronic devices, sometimes without carefully regimented management of the cables. The connections of each cable may be remote from one another, even being in separate rooms or spaces, and the networking cables may be of substantial length.

One example of such use of networking cables is in computer centers where it is often necessary to connect a networking cable from an individual workstation at one location with another networking cable from a computer server remote from the workstation. Further the interconnections sometimes are located in crowded and/or cramped quarters. Tracing and identifying a remote connector section or end of a specific cable for changing its connection in a network or to facilitate replacement often is difficult, tedious and time consuming, and can lead to errors that create further service problems and additional costs.

Various methods and systems have been developed for locating the ends of a networking cable. One such method is a trial and error process that requires personnel to use test equipment at both ends of each and every wire pair to identify the termination points. This process may be labor intensive and expensive. The second method is a variation of the first method and involves the use of equipment to send a tone on a wire pair and then detect a particular frequency at the termination point. This process is also labor intensive. Also, to determine termination points, the cable needs to be disconnected from the computers connected to the network. As a result, these methods interfere with performance and require the workstation to be taken out of service. In addition, both systems require the test person to walk from one end of a test point to the other end. If the workstation and server are located in separate rooms or in remote locations, the previous methods are labor intensive and inefficient for easy detection of termination ends.

U.S. Pat. No. 6,577,243 to Dannenmann, et. al. describes a network cable tracing system that addresses some of these issues. Electrically activated telltales, such as light emitting diodes (LED's) are affixed to both ends of a networking cable and are activated when power is applied externally with a plug-in connection from a portable power pack. The resulting illumination of the LED's readily indicates where both ends of the networking cable are located. A system similar to this is offered by Cypress Industries, of Austin, Tex. and called the LED Cat5E RJ45 Patch Cable. A solution of this type is useful and an improvement over some of the aforementioned labor intensive test methods. This approach has not been widely adopted though because it requires the technician to purchase a rather limited use power pack, carry it along with all of his or her other tools and individually plug it into each networking cable as part of a test protocol. Each cable also has to have a plug in connection on each end of the cable for the power pack to be attached.

There is a need for an improved mode of readily tracing networking cables that is much easier to use, lower in cost, does not require any separate power packs, and does not require plug in connections on the networking cables. The instant invention to be described addresses this need.

BRIEF SUMMARY OF THE INVENTION

It is therefore an aspect of the instant invention to provide a network cable tracing system that is contained to the network cables, low in cost, and straightforward to use.

It is a feature of the instant invention that the test function is implemented simply by pushing a button on the networking cable hood.

It is another feature of the instant invention that the only power required is provided by a low cost battery enclosed in the network cable hood.

It is another feature of the instant invention that no external test equipment is required.

These and other aspects and features are achieved by the present invention by providing an indicator circuit for signaling a cable connection between two electronic devices including at least a networking cable having a plurality of metal wire pairs encased in a flexible sheath; a connection hood on each end of the networking cable; an electrically activated telltale incorporated into each connection hood and electrically connected to at least one of the metal wire pairs; a battery incorporated into at least one of the connection hoods and in electrical connection with the electrically activated telltales; and a manually operated switch incorporated into at least one of the connection hoods and in electrical connection with the electrically activated telltales.

Further aspects and features are achieved by the present invention by providing an indicator circuit for signaling a cable connection between two electronic devices including at least a networking cable having a plurality of metal wire pairs encased in a flexible sheath; a connection hood on each end of the networking cable; an electrically activated telltale incorporated into each connection hood and electrically connected to at least one of the metal wire pairs; a battery incorporated into at least one of the connection hoods and in electrical connection with the electrically activated telltales; a manually operated switch incorporated into at least one of the connection hoods and in electrical connection with the electrically activated telltales; and electric circuit elements incorporated into each hood connection and in electrical connection with the electrically activated telltales; wherein the electric circuit elements complete the circuit for a prescribed amount of time when activated by the manually operated switch.

Further aspects and features are achieved by the present invention by providing an indicator circuit for signaling a cable connection between two electronic devices including at least a networking cable having a plurality of metal wire pairs encased in a flexible sheath; a connection hood on each end of the networking cable; an electrically activated telltale incorporated into each connection hood and electrically connected to at least one of the metal wire pairs; a battery incorporated into at least one of the connection hoods and in electrical connection with the electrically activated telltales; a manually operated switch incorporated into at least one of the connection hoods and in electrical connection with the electrically activated telltales; and an integrated circuit chip, incorporated into each hood connection and in electrical connection with the electrically activated telltales; wherein the integrated circuit chip completes the circuit for a prescribed amount of time when activated by the manually operated switch.

Further aspects and features are achieved by the present invention by providing a networking cable for transmitting data comprising a plurality of metal wire pairs encased in a flexible sheath; a plurality of twisted copper wire pairs encased in a flexible sheath; an electrically activated telltale incorporated into each connection hood and electrically connected to at least one of the metal wire pairs; a battery incorporated into at least one of the connection hoods and in electrical connection with the electrically activated telltales; and a manually operated switch incorporated into each connection hood and in electrical connection with the electrically activated telltales.

Further aspects and features are achieved by the present invention by providing a networking cable for transmitting data comprising a plurality of metal wire pairs encased in a flexible sheath; a plurality of twisted copper wire pairs encased in a flexible sheath; an electrically activated telltale incorporated into each connection hood and electrically connected to at least one of the metal wire pairs; a battery incorporated into at least one of the connection hoods and in electrical connection with the electrically activated telltales; manually operated switch incorporated into each connection hood and in electrical connection with the electrically activated telltales; and electric circuit elements incorporated into each hood connection and in electrical connection with the electrically activated telltales; wherein the electric circuit elements complete the circuit for a prescribed amount of time when activated by the manually operated switch.

Further aspects and features are achieved by the present invention by providing a networking cable for transmitting data comprising a plurality of metal wire pairs encased in a flexible sheath; a plurality of twisted copper wire pairs encased in a flexible sheath; an electrically activated telltale incorporated into each connection hood and electrically connected to at least one of the metal wire pairs; a battery incorporated into at least one of the connection hoods and in electrical connection with the electrically activated telltales; manually operated switch incorporated into each connection hood and in electrical connection with the electrically activated telltales; and an integrated circuit chip, incorporated into each hood connection and in electrical connection with the electrically activated telltales; wherein the integrated circuit chip completes the circuit for a prescribed amount of time when activated by the manually operated switch.

DETAILED DESCRIPTION OF THE INVENTION

Figure 1:
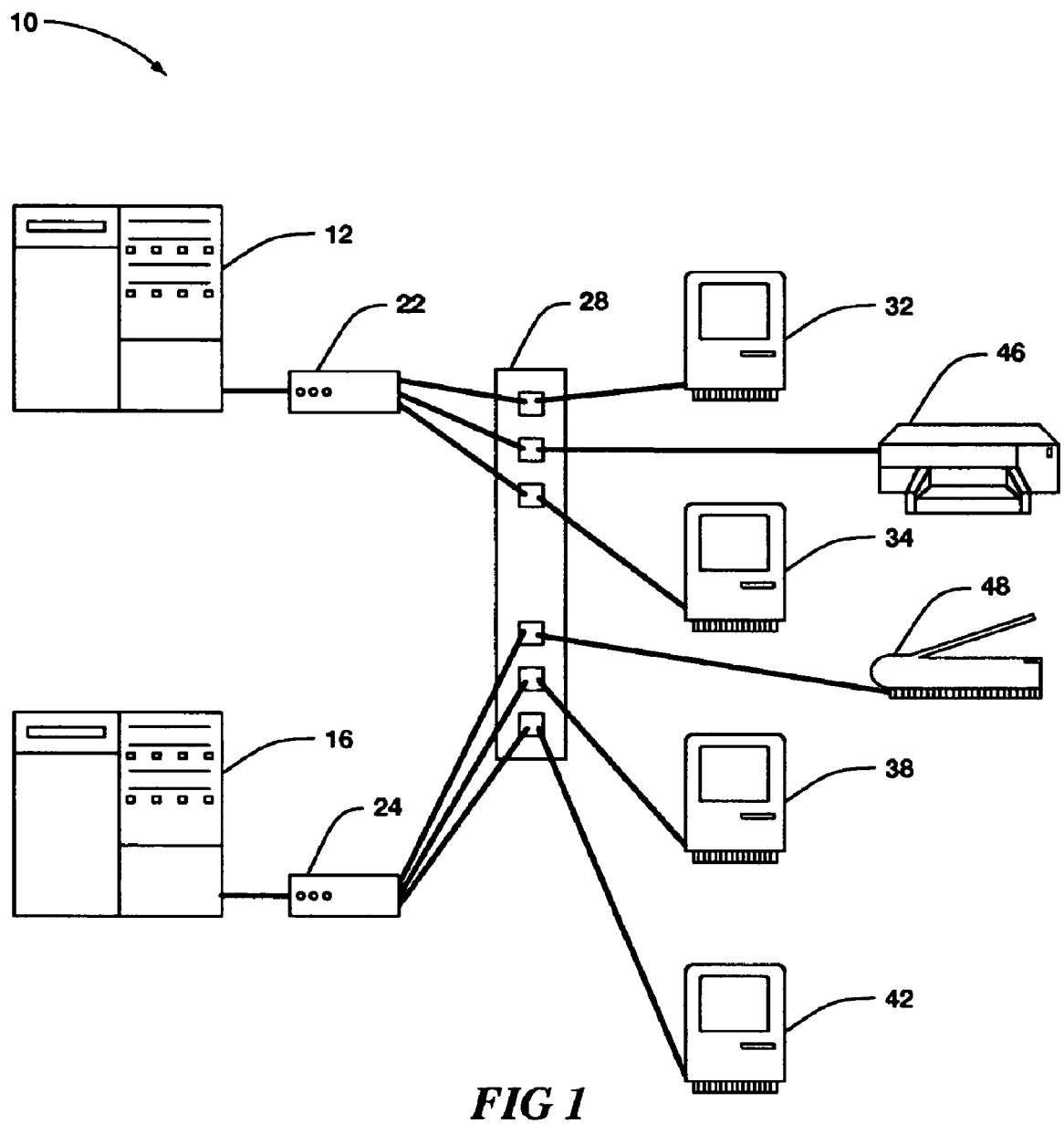
FIG. 1 is a schematic view of a networked computer environment.

FIG. 1, shown generally by the numeral 10, illustrates, by way of background, a typical networked environment that includes servers, computers, hubs, peripheral devices, and a cable panel.

In this example computers 32, 34, 38, and 42 are each connected by networking cables to a cable panel 28. The computers can be at multiple locations. Also attached to panel 28 by networking cable are peripheral devices such as printer 46 and scanner 48. Panel 28 is often located at a central room where service personnel can access it. From panel 28 multiple computers and peripheral devices are often then linked by networked cables to hubs such as 22 and 24, which then are connected to servers such as 12 and 16. Typically, one room may house multiple servers and hubs. Various protocols are used to support data transfer between computer and server pairs. A typical protocol is Ethernet.

The example shown is a small network and typical networks are much larger. In addition to the devices shown in FIG. 1 a network could include, but is not limited to, other electronic devices such as workstations, switches, tape drives, storage devices, telephone switches, VOIP devices, and routers. The application of the instant invention anticipates any electronic device that can be part of a network. With large networks the total number of networking cables is large and routine maintenance functions as well as the addition or change of computers can lead to significant time and manpower requirements in tracing down connections throughout the system.

Figure 2:
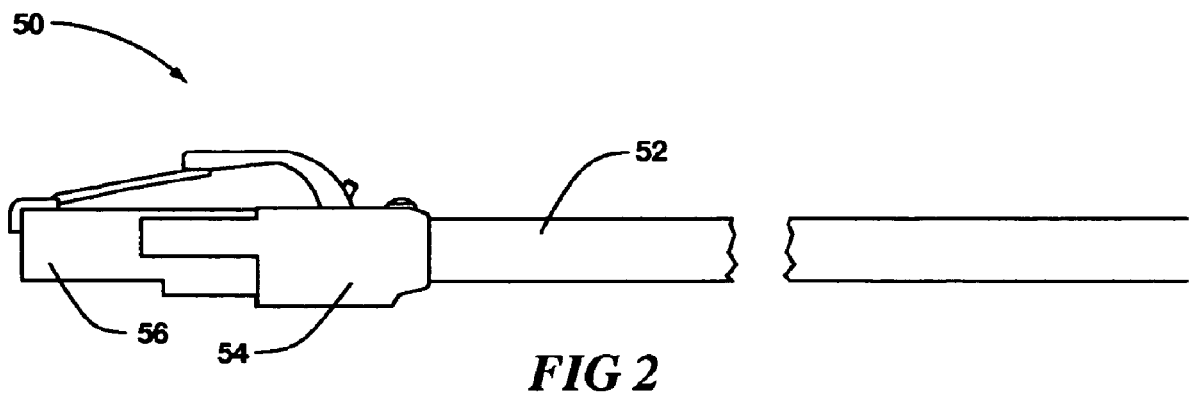
FIG. 2 is a diagrammatic front elevation view of the network cable of the instant invention.

FIG. 2, shown generally by the numeral 50, illustrates a networking cable of the instant invention that may be used in the networked environment of FIG. 1. Cable 52, as used in networking applications is typically composed of a plurality of insulated twisted metal wire pairs encased in a flexible outer cover sheath. The number of twisted metal wire pairs can vary depending on the application. A well-known standard is the Category 5 cabling standard, which has four insulated twisted copper wires encased in an outer jacket layer. These are referred to as Cat5 cables. Several other standards are in use and the instant invention anticipates the use of any of them. In the case of the instant invention an additional metal wire pair is added so that a Cat5 cable made to make use of the instant invention would have 4 metal wire pairs and one additional pair of wires for the tracing function. The extra metal wire pair will be referred to in this description as the indicator wire pair. It should also be noted that the composite cable may consist of coaxial, twin-axial, twisted, untwisted, shielded and unshielded pair wires, as is known in the art. Accordingly, the term "networking cable" is used in this description and in the appended claims will encompass all such variations of composite cable.

A connector assembly made up of a standard connector 56 coupled to a boot 54 on the end of the networking cable provides for the connection of the cable to the various networked devices. A typical connector 56 is an RJ45, an eight wire connector commonly used in networking computers. The overall connecter (connector plus boot) will be referred to as the hood in this description and in the appended claims.

Figure 3:
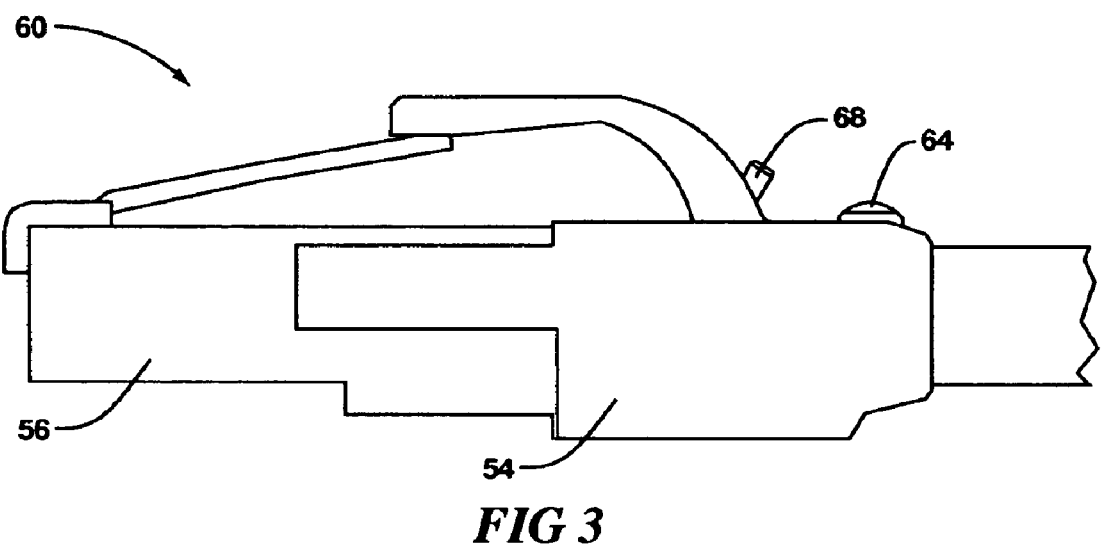
FIG. 3 is a diagrammatic front elevation view of the hood of the network cable of the instant invention.

FIG. 3, shown generally as the numeral 60 is a slightly enlarged illustration of the hood of the instant invention. Near the rear section of boot 54 is an electrical telltale 64, which can be used to produce an audio or visual signal for tracing network cables. For purposes of this description and the appended claims a telltale can be any electrically triggered device that emits a visual or audio signal that can be detected by a human. A preferred telltale is a light emitting diode (LED), but could be other visual indicators such as a conventional light bulb, or a liquid crystal visual indicator. A button 68 is shown, which can be manually pressed to engage a manual switch (not shown) which competes an indicator circuit that causes the telltale LED to flash repeatedly for a predetermined time. The indicator circuit includes the indicator wire pair that runs the complete length of the networking cable. It is important to note that the hood shown in FIG. 2, which is shown on the "left" end of the networking cable has a identical twin hood on the "right" end that has identical circuitry as well as an LED and manual switch and is in electrical connection via the indicator wire pair.

Figure 4:
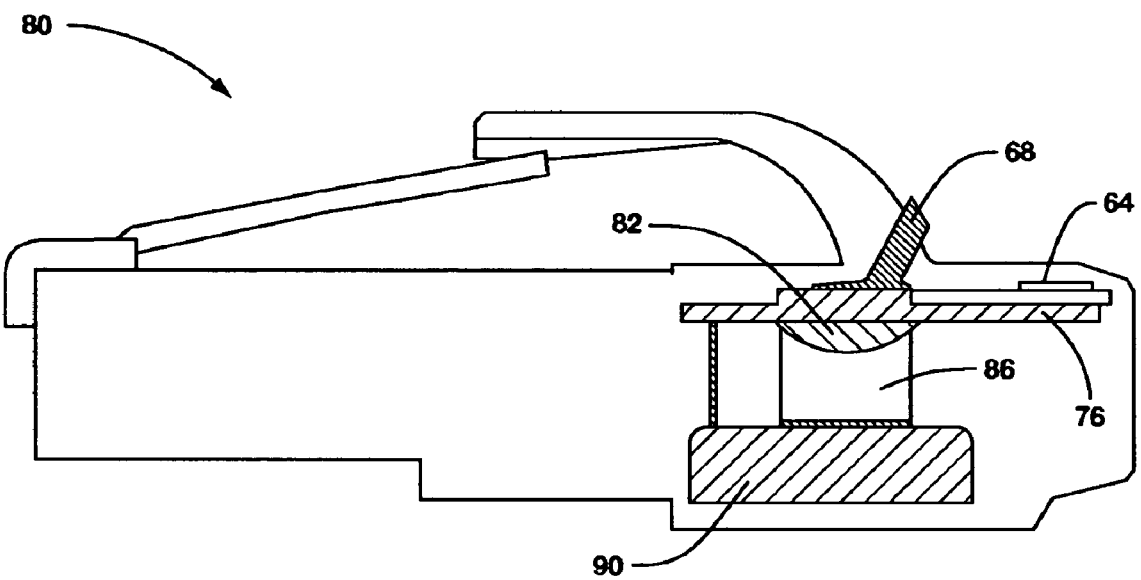
FIG. 4 is a diagrammatic cross section front elevation view of the hood of the network cable of the instant invention.
Figure 5:
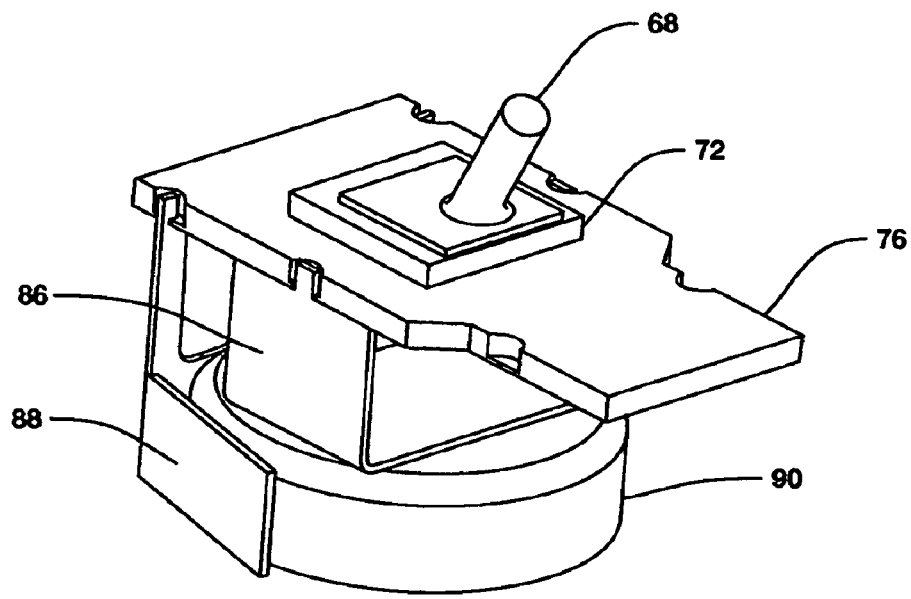
FIG. 5 is an interior view of the some of the interior elements of the hood of the network cable of the instant invention.

FIG. 4, shown generally by the numeral 80 is another side view of the hood shown in cross section to demonstrate some of the internal components. Button 68 is connected physically to a switch (to be shown) which when manually engaged completes an electrical circuit that powers electrical telltale 64. Referring to FIG. 5 button 68 engages switch 72 that is mounted on printed circuit board 76. Below printed circuit board 76 is an integrated circuit 82 (FIG. 4) that provides part of the intelligence of an embodiment of the instant invention and will be described further. Referring back to FIG. 5 printed circuit board 76 is in electrical connection to a battery 90 via positive connection 86 and negative connection 88. The wiring of a complete electrical circuit between electrical telltale 64, switch 72, integrated circuit 82, and battery 90 is done through the common printed circuit board 76.

Figure 6:
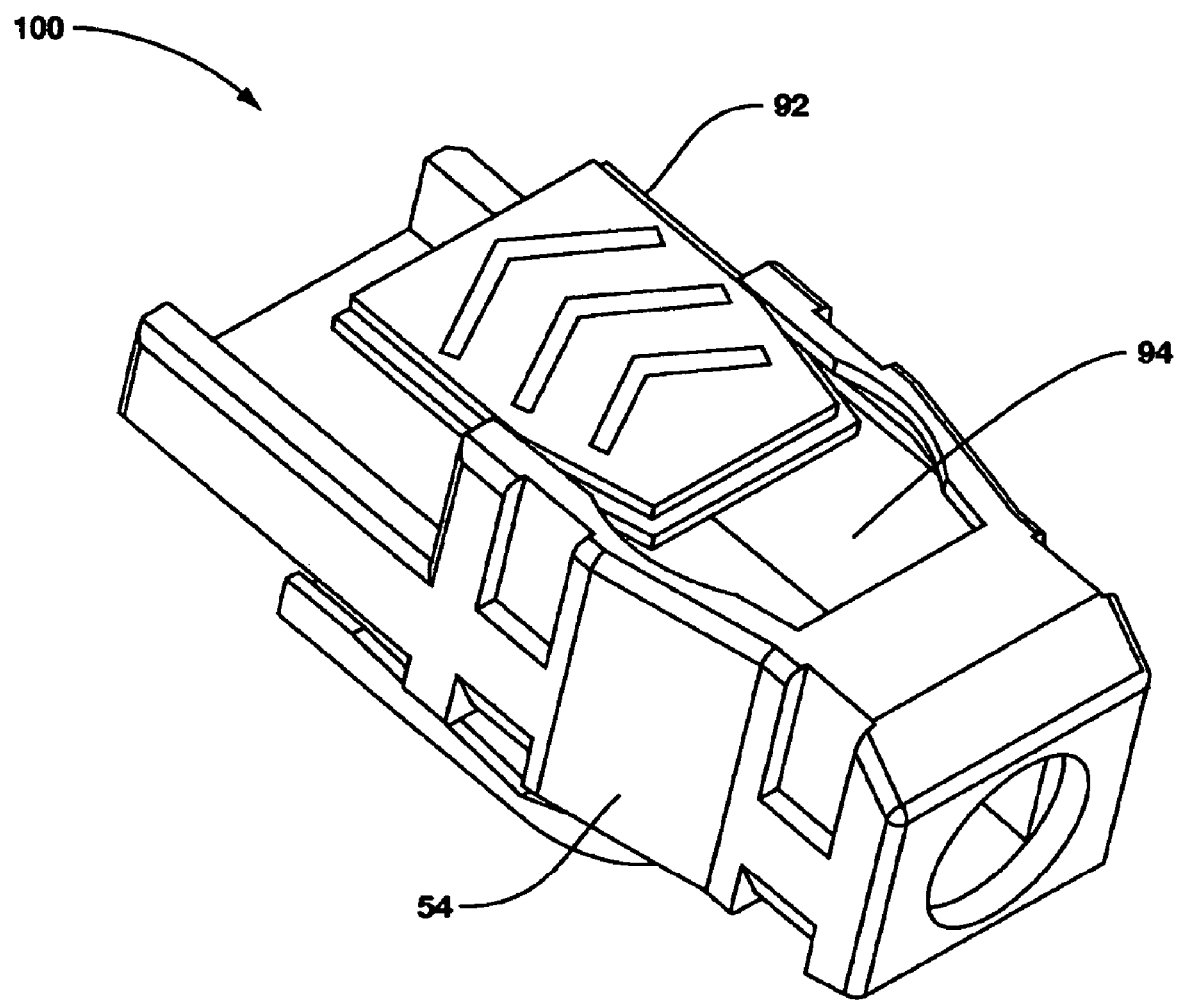
FIG. 6 is a diagrammatic bottom elevation view of the boot of the network cable of the instant invention.

FIG. 6, shown generally by the numeral 100, is a bottom view of boot 54 to show the battery port in which door 92 can be moved to an open position to expose the battery port 94 where the battery (90 in FIG. 5) can be inserted. A number of batteries can be used in this application. For the circuit components discussed in the example of the instant invention a preferred battery is a CR927 3-volt lithium battery. A number of similar batteries are available from other manufacturers and the instant invention anticipates the use of any of them.

An important aspect of the instant invention is the ability to have a useful and long-lived tracer circuit with only the on board batteries. Accordingly when the switch 72 is engaged by pushing button 68 (FIGS. 4-5) it is desirable for the electrical telltales to signal for a prescribed amount of time but then shut off to conserve battery power. This can be accomplished in this invention in several ways. The simplest circuit would be one in which the circuit is engaged and drawing power from battery 90 once the first button 68 is pushed and is disengaged when one of the buttons 68 is pushed again. This embodiment is one aspect of the instant invention. This embodiment is functional though it suffers from the weakness that users may accidentally push one of the buttons and leave the circuit engaged, draining the power from battery 90. An improved embodiment (the second embodiment) is one in which pushing one of the buttons 68 engages power to the circuit for a prescribed amount of time and then disengages power to the circuit, conserving battery power. A number of simple electronic circuits could perform that function. Fortunately very small and low cost integrated circuits designed to do exactly that as well as pulse the power are commercially available in large quantities. Integrated circuit board X1622 available from Fulikai Electronic Technologies (China), is manufactured and sold to numerous toy manufacturers to provide a blinking light function to many toys. It is also used in the well-known shoes sold to children that have blinking LED lights that are activated when children press down on the shoes while walking. A number of similar integrated circuits are available from other manufacturers and the instant invention anticipates the use of any of them.

Figure 7:
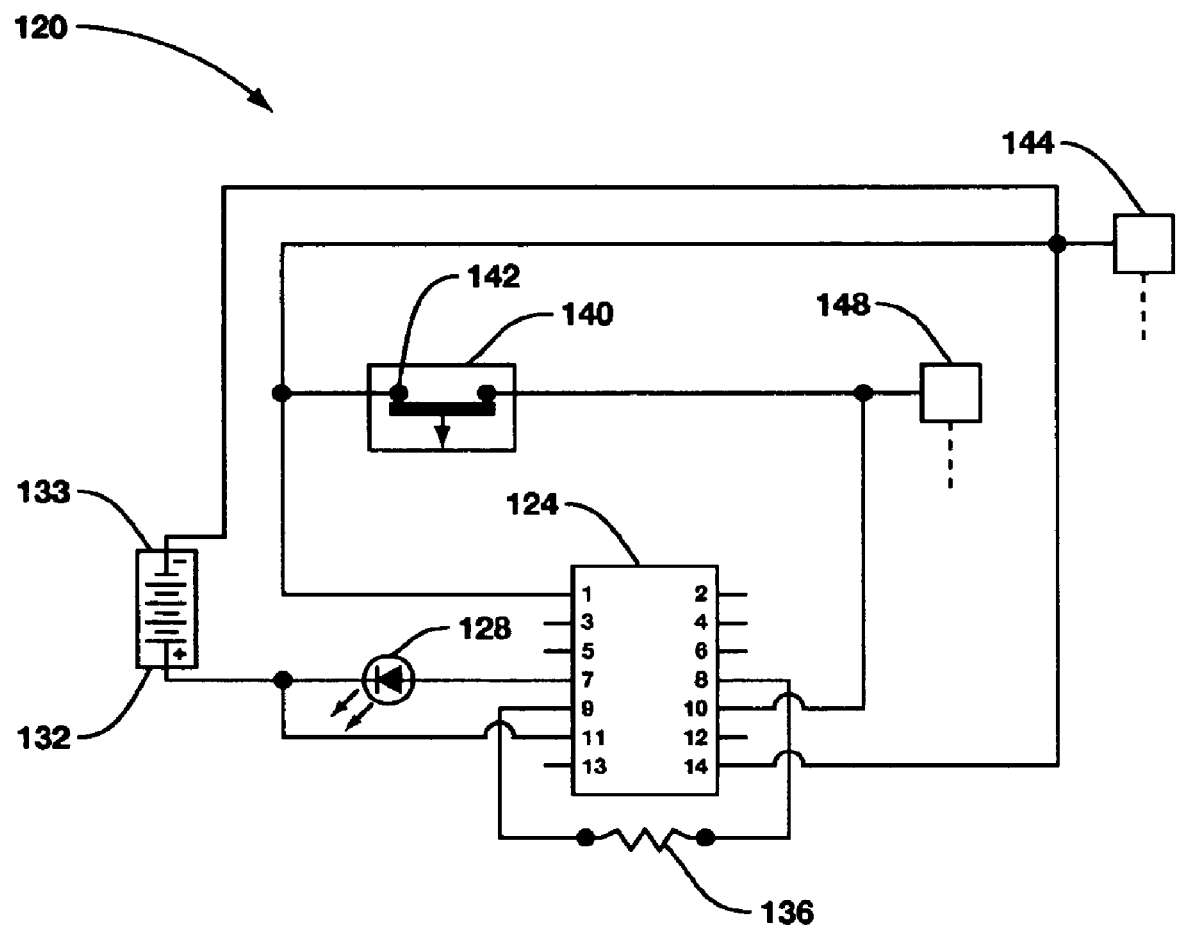
FIG. 7 is a schematic view of the indicator circuit of the instant invention.

FIG. 7, shown generally by the numeral 120, is a schematic of the complete direct current circuit of the instant invention for one of the connection boots. Integrated circuit 124 is shown in the middle of the circuit and corresponds to integrated circuit 82 in FIG. 4, which is mounted under printed circuit board 76. Returning to FIG. 7, a light emitting diode (LED) 128 is in electrical connection with pin 7 of chip 124 and is in power connection to a positive charge from battery 132 as well as pin 11 of chip 124. Resistor 136 is connected across pins 8 and 9 of chip 124 and sets both the frequency and duration of power pulses sent to LED 128. For example with the X1622 IC chip a 220-ohm resistor used as resistor 136 will deliver pulses that blink LED 128 for about 19 seconds. A smaller resistor will increase the frequency of blinking and shorten the total duration. Switch 140 corresponds to the switch 72 of FIG. 5 and when activated starts the pulsing of power to the LED that proceeds for a prescribed amount of time. The ground or negative side of the battery 133 is connected to side (A) of switch 140, as well as pins 1 and 14 of integrated circuit 124. Finally circuit 120 is connected to an identical mirror image circuit (with an identical integrated circuit, LED, battery, etc.) in an identical connection hood at the other end of the networking wire. Wire 144 is the ground wire of the tracer pair and is connected to the identical ground wire on the other end of the networking cable. Similarly wire 148 is attached to the identical part of the circuit at the other end of the networking cable. Thus when switch 140 is engaged on either end of the networking cable both LED's flash for the prescribed amount of time.

The resulting networking cable is a completely self-contained tracing cable. It enables any technician or user to simply push one button to check for the location of the opposite end of a cable in a networked system. In the case of the second embodiment the telltale indication ceases after a prescribed amount of time, conserving battery power.

While the invention has been described above with references to specific embodiments thereof, it is apparent that many changes, modifications and variations in the materials, arrangements of parts and steps can be made without departing from the inventive concept disclosed herein. Accordingly, the spirit and broad scope of the appended claims are intended to embrace all such changes, modifications and variations that may occur to one of skill in the art upon a reading of the disclosure. All patent applications, patents and other publications cited herein are incorporated by reference in their entirety.

The invention claimed is:

1. An indicator circuit for signaling a cable connection between two electronic devices comprising:
   a. a networking cable having a plurality of metal wire pairs encased in a flexible sheath;
   b. a connection hood on each end of the networking cable;

c. an electrically activated telltale incorporated into at least one of the connection hoods and electrically connected to at least one of the metal wire pairs;
d. a battery incorporated into at least one of the connection hoods and in electrical connection with the electrically activated telltale; and
e. a manually operated switch incorporated into at least one of the connection hoods and in electrical connection with the electrically activated telltale.

2. The indicator circuit of claim 1 further comprising an electric circuit element incorporated into at least one of the connection hoods and in electrical connection with the electrically activated telltale; wherein the electric circuit element completes the circuit for a prescribed amount of time when activated by the manually operated switch.

3. The indicator circuit of claim 1 further comprising an integrated circuit chip, incorporated into at least one of the connection hoods and in electrical connection with the electrically activated telltale; wherein the integrated circuit chip completes the circuit for a prescribed amount of time when activated by the manually operated switch.

4. The indicator circuit of claim 3 wherein the integrated circuit chip performs the function of pulsing the power to the electrically activated telltale for the prescribed amount of time.

5. The indicator circuit of claim 4 further comprising a resistor electrically connected to the integrated circuit chip wherein the size of the resistor sets the prescribed amount of time.

6. The indicator circuit of claim 1 wherein the electrically activated telltale emits an audio signal.

7. The indicator circuit of claim 1 wherein the electrically activated telltale emits a visual signal.

8. The indicator circuit of claim 7 wherein the electrically activated telltale is selected from the group consisting of a light emitting diode, a conventional light bulb, and a liquid crystal visual indicator.

9. A networking cable for transmitting data comprising:
a. a plurality of metal wire pairs encased in a flexible sheath;
b. a connection hood on each end of the networking cable;
c. an electrically activated telltale incorporated into at least one of the connection hoods and electrically connected to at least one of the metal wire pairs;
d. a battery incorporated into at least one of the connection hoods and in electrical connection with the electrically activated telltale; and
e. manually operated switch incorporated into at least one of the connection hoods and in electrical connection with the electrically activated telltale.

10. The networking cable of claim 9 further comprising an electric circuit element incorporated into at least one of the connection hoods and in electrical connection with the electrically activated telltale; wherein the electric circuit element completes the circuit for a prescribed amount of time when activated by the manually operated switch.

11. The networking cable of claim 9 further comprising an integrated circuit chip, incorporated into at least one of the connection hoods and in electrical connection with the electrically activated telltale; wherein the integrated circuit chip completes the circuit for a prescribed amount of time when activated by the manually operated switch.

12. The networking cable of claim 11 wherein the integrated circuit chip performs the function of pulsing the power to the electrically activated telltale for the prescribed amount of time.

13. The networking cable of claim 12 further comprising a resistor electrically connected to the integrated circuit chip wherein the size of the resistor sets the prescribed amount of time.

14. The networking cable of claim 9 wherein the electrically activated telltale emits an audio signal.

15. The networking cable of claim 9 wherein the electrically activated telltale emits a visual signal.

16. The networking cable of claim 15 wherein the electrically activated telltale is selected from the group consisting of a light emitting diode, a conventional light bulb, and a liquid crystal visual indicator.

* * * * *